(12) United States Patent
Xie et al.

(10) Patent No.: US 9,576,857 B1
(45) Date of Patent: Feb. 21, 2017

(54) METHOD AND STRUCTURE FOR SRB ELASTIC RELAXATION

(71) Applicant: GLOBALFOUNDRIES Inc., Grand Cayman (KY)

(72) Inventors: Ruilong Xie, Schenectady, NY (US); Murat Kerem Akarvardar, Saratoga Springs, NY (US); Andreas Knorr, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/058,238

(22) Filed: Mar. 2, 2016

(51) Int. Cl.
| | | |
|---|---|---|
| *H01L 21/8238* | (2006.01) | |
| *H01L 27/092* | (2006.01) | |
| *H01L 29/10* | (2006.01) | |
| *H01L 21/3105* | (2006.01) | |
| *H01L 21/321* | (2006.01) | |
| *H01L 21/762* | (2006.01) | |
| *H01L 29/78* | (2006.01) | |

(52) U.S. Cl.
CPC ... *H01L 21/823807* (2013.01); *H01L 21/3105* (2013.01); *H01L 21/32105* (2013.01); *H01L 21/823821* (2013.01); *H01L 27/0924* (2013.01); *H01L 29/1054* (2013.01); *H01L 21/76224* (2013.01); *H01L 29/7842* (2013.01)

(58) Field of Classification Search
CPC .............. H01L 21/823807; H01L 21/823821; H01L 21/3105; H01L 21/76224; H01L 21/7842; H01L 29/1054; H01L 29/7842; H01L 29/16; H01L 29/785; H01L 29/66818
USPC 438/199, 283, 223, 224, 227, 228; 257/369, 371, 401, 347
See application file for complete search history.

(56) References Cited

U.S. PATENT DOCUMENTS

2016/0056277 A1* 2/2016 Lee ..................... H01L 29/785
257/401

* cited by examiner

*Primary Examiner* — Thinh T Nguyen
(74) *Attorney, Agent, or Firm* — Ditthavong & Steiner, P.C.

(57) ABSTRACT

A method of forming SRB finFET fins first with a cut mask that is perpendicular to the subsequent fin direction and then with a cut mask that is parallel to the fin direction and the resulting device are provided. Embodiments include forming a SiGe SRB on a substrate; forming a Si layer over the SRB; forming an NFET channel and a SiGe PFET channel in the Si layer; forming cuts through the NFET and PFET channels, respectively, and the SRB down to the substrate, the cuts formed on opposite ends of the substrate and perpendicular to the NFET and PFET channels; forming fins in the SRB and the NFET and PFET channels, the fins formed perpendicular to the cuts; forming a cut between the NFET and PFET channels, the cut formed parallel to the fins; filling the cut with oxide; and recessing the oxide down to the SRB.

9 Claims, 21 Drawing Sheets

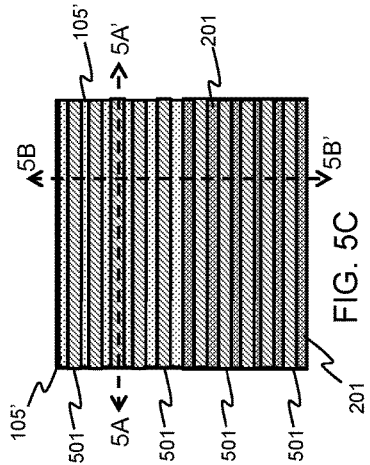
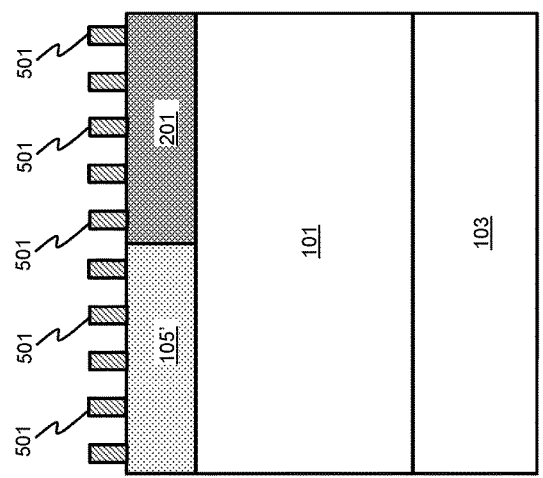
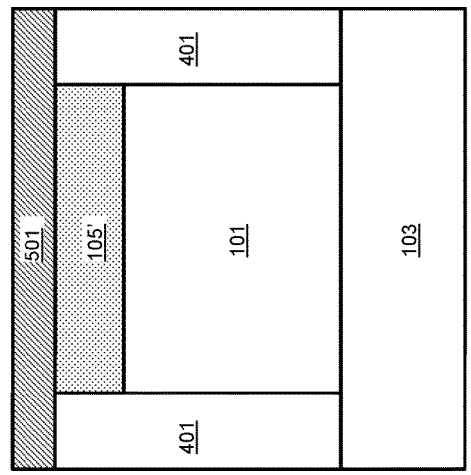

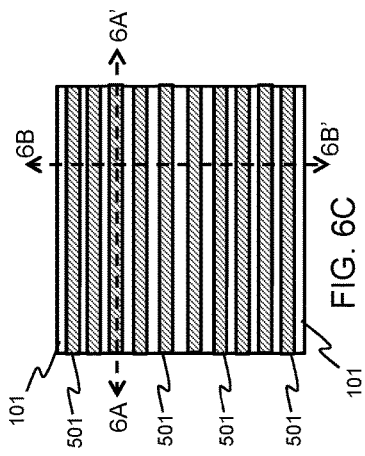
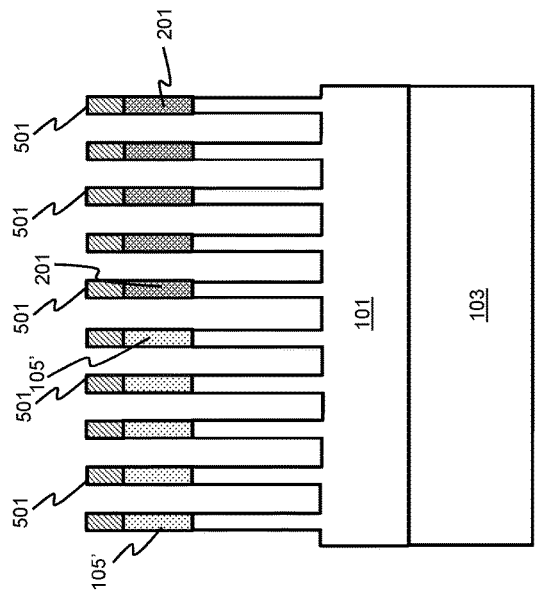
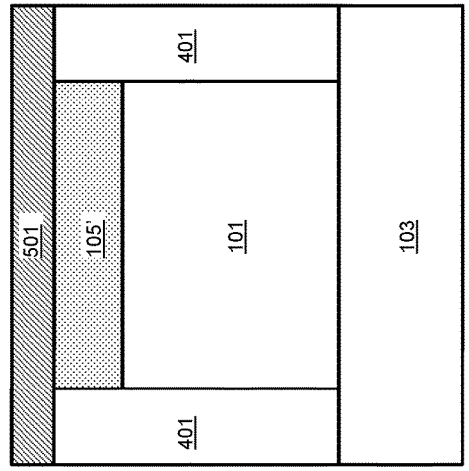
FIG. 6C
FIG. 6B
FIG. 6A

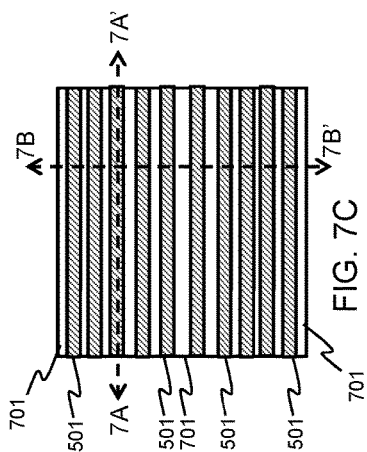
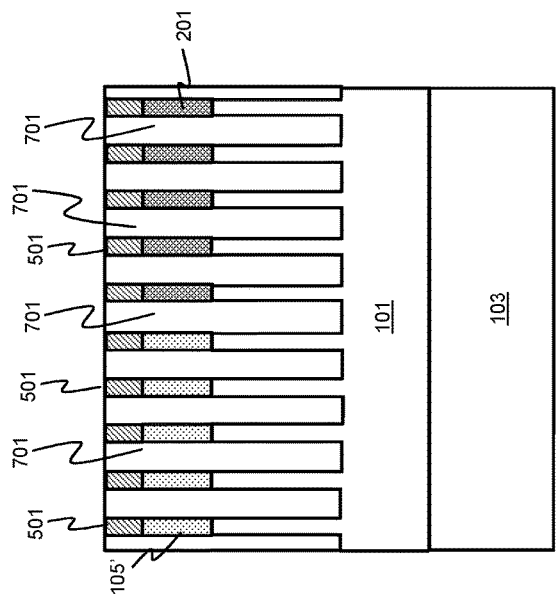
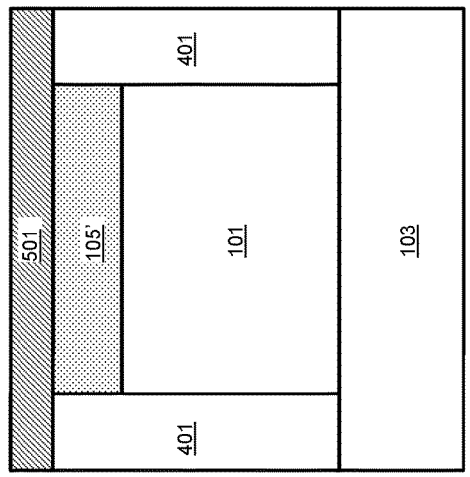
FIG. 7C
FIG. 7B
FIG. 7A

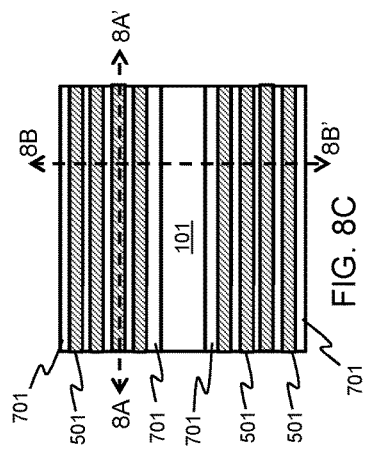
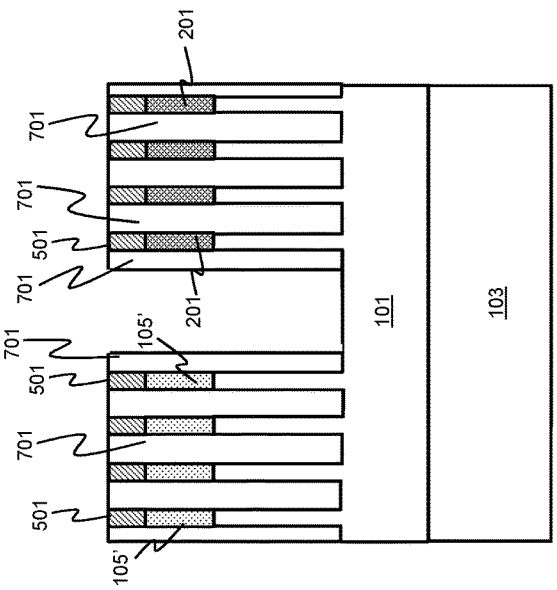
FIG. 8C
FIG. 8B
FIG. 8A

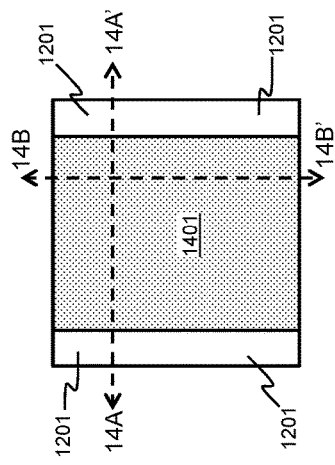
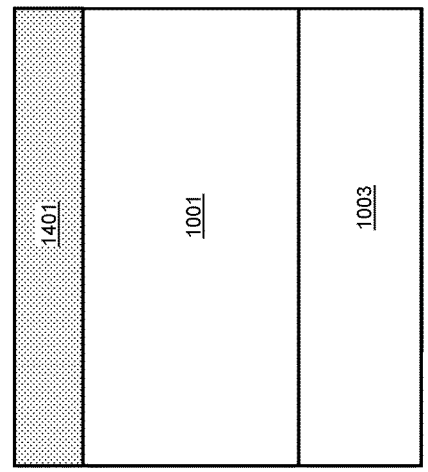
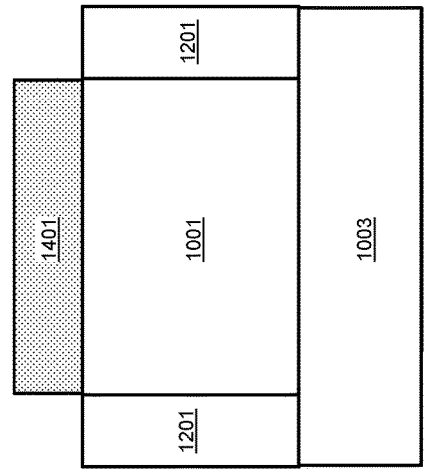
FIG. 14C
FIG. 14B
FIG. 14A

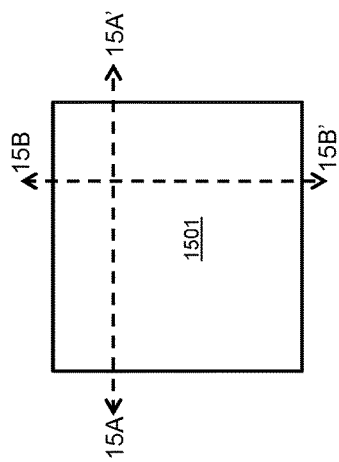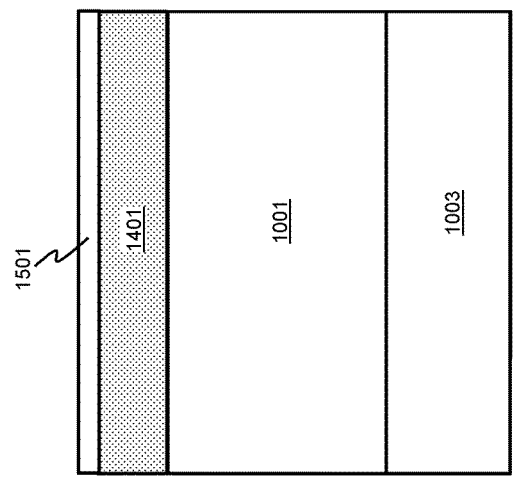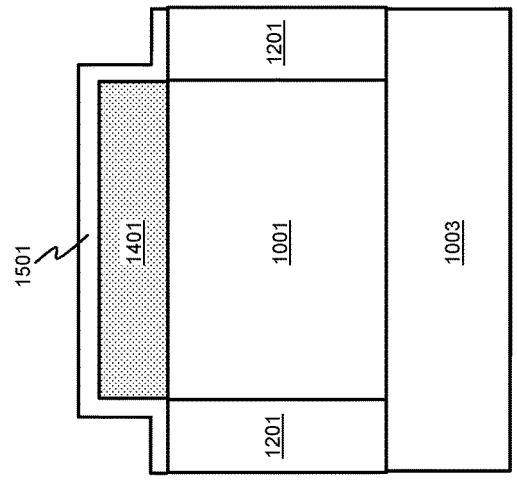

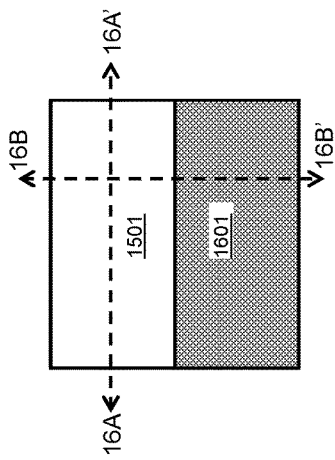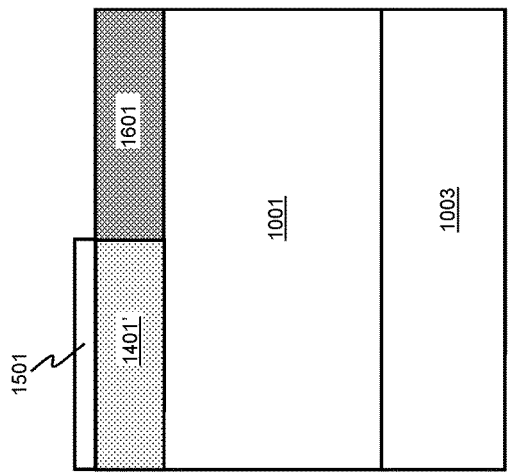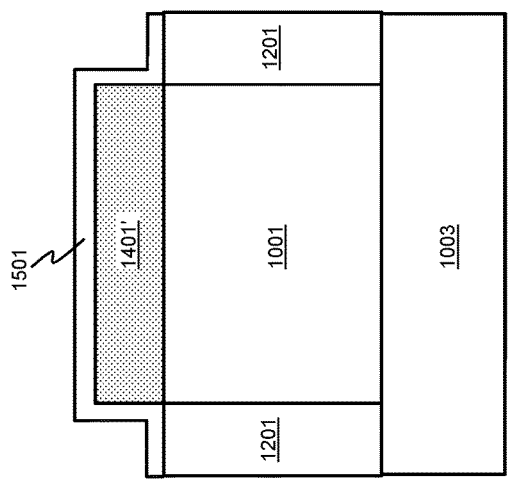

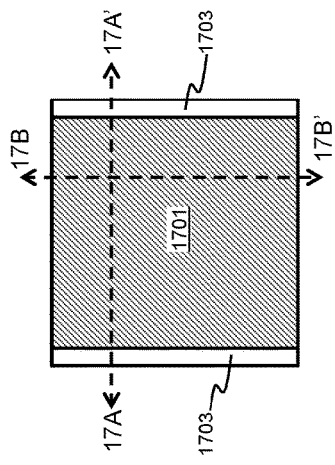
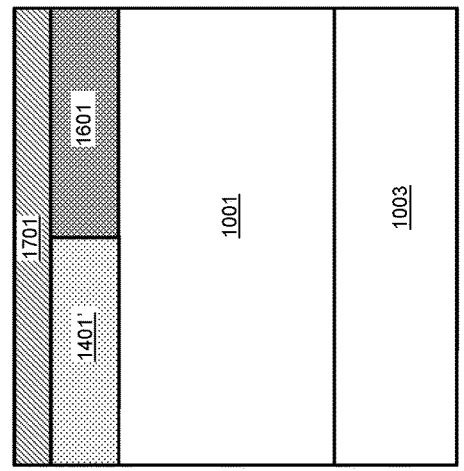
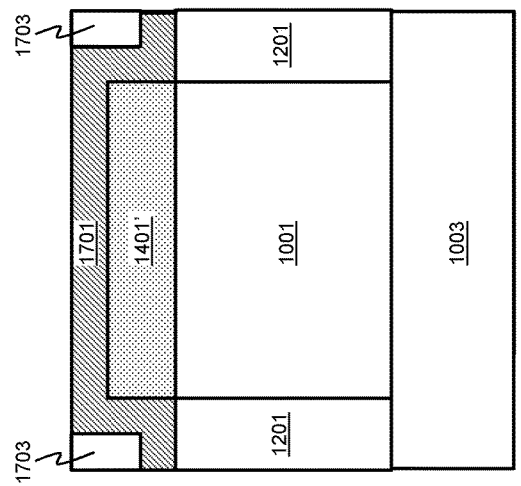
FIG. 17C
FIG. 17B
FIG. 17A

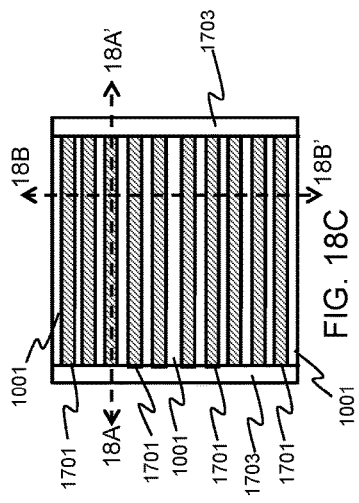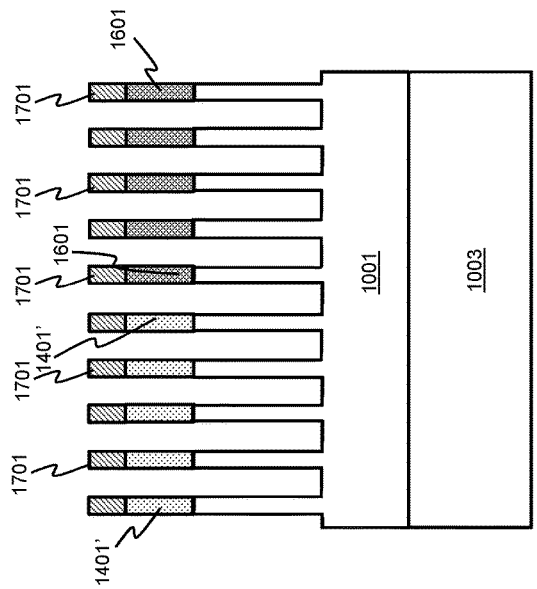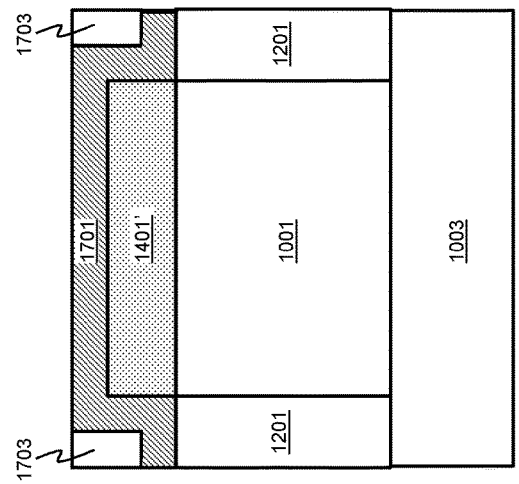
FIG. 18C
FIG. 18B
FIG. 18A

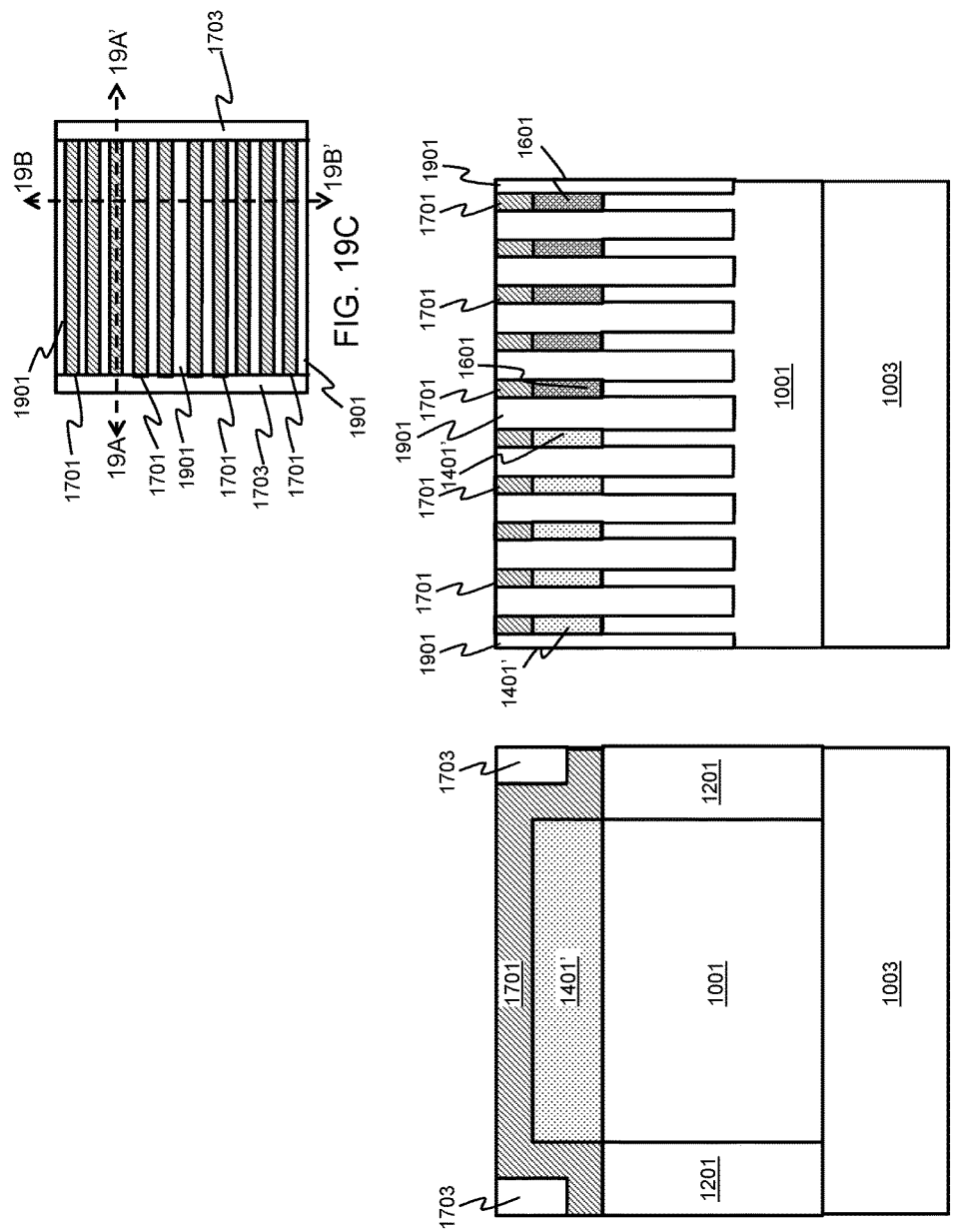

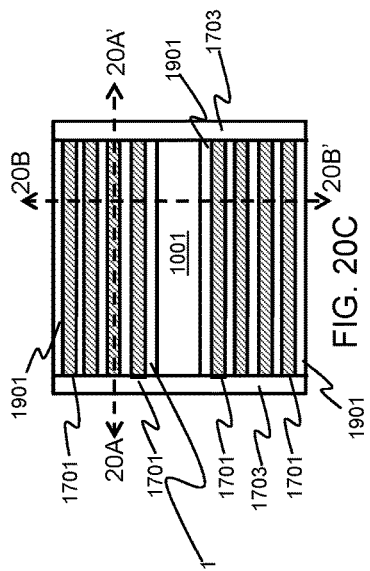
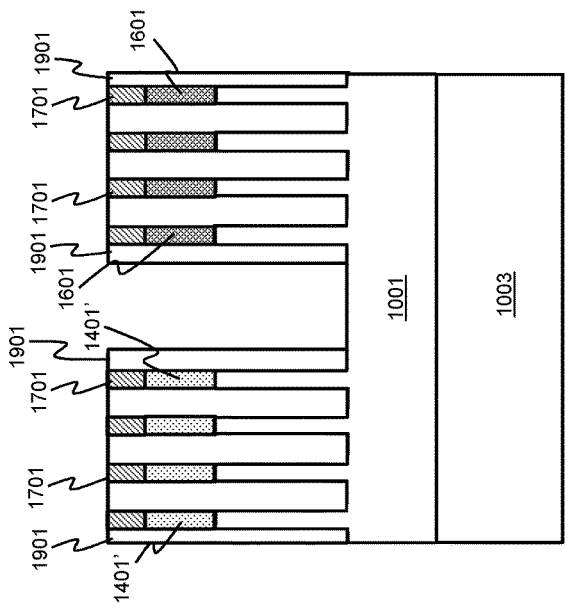
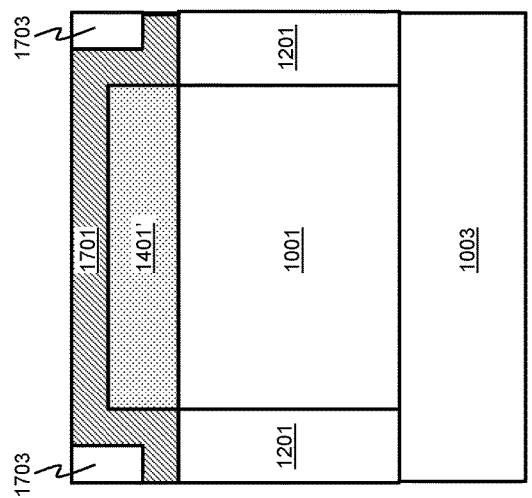
FIG. 20C
FIG. 20B
FIG. 20A

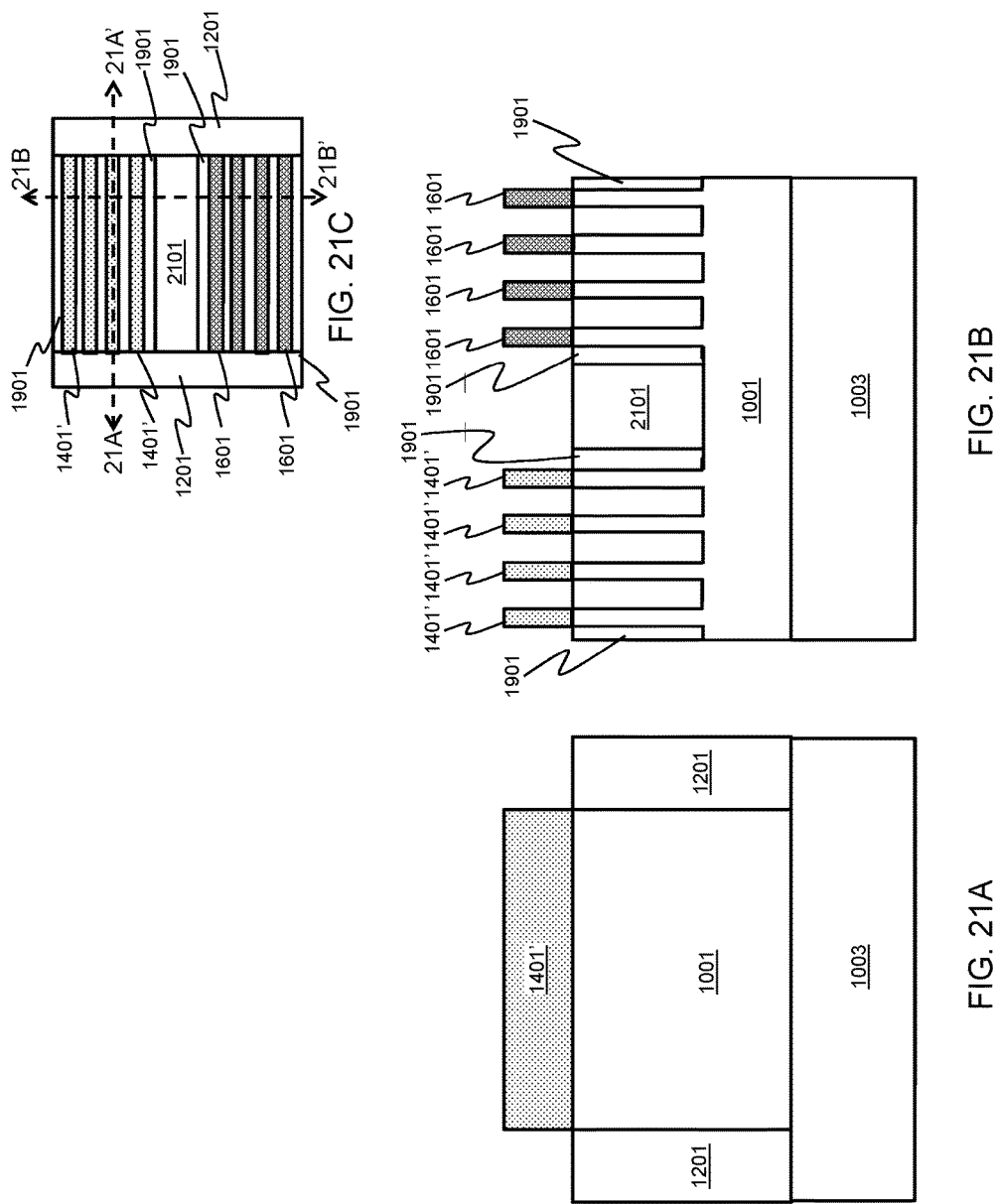

US 9,576,857 B1

METHOD AND STRUCTURE FOR SRB ELASTIC RELAXATION

TECHNICAL FIELD

The present disclosure relates to methods of manufacturing semiconductor devices with strain relaxed buffers (SRBs). The present disclosure is particularly applicable to the formation of the fins of a fin-type field effect transistor (finFET).

BACKGROUND

Forming a finFET device through an early silicon germanium (SiGe) epitaxial (epi) cut process offers an opportunity to achieve defect free elastic relaxation. One option is to use a dummy cut. However, a dummy cut requires additional masks and introduces a number of design restrictions to prevent the channel from falling into the cut region. A second option is to first use a cut mask that is parallel to the fin direction (FH) and then to use a cut mask that is perpendicular to the fin direction (FC). However, starting with the FH cut mask can damage the end of the fins due to the etch load effect. Consequently, fins at the end of the array will have a different critical dimension (CD) or profile relative to the fins towards the center of the array.

A need therefore exists for methodology enabling uniform fin CD and profile without requiring additional masks or introducing significant design restrictions, and the resulting device.

SUMMARY

An aspect of the present disclosure is a method of forming SRB finFET fins first with a cut mask that is perpendicular to the subsequent fin direction and then using a cut mask that is parallel to the fin direction.

Another aspect of the present disclosure is a SRB finFET device with defect free elastic relaxation and uniform fin CD and profile.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a SiGe SRB on a silicon (Si) substrate; forming a Si layer over the SiGe SRB; forming an n-type field-effect transistor (NFET) channel and a SiGe p-type FET (PFET) channel in the Si layer and adjacent to each other; forming a silicon nitride (SiN) layer over the NFET and PFET channels; forming first and second cuts through the SiN layer, the NFET and PFET channels, respectively, and the SiGe SRB down to the Si substrate, the first and second cuts formed on opposite ends of the Si substrate and perpendicular to the NFET and PFET channels; forming fins in the SiGe SRB through the SiN layer and the NFET and PFET channels, the fins formed perpendicular to the first and second cuts; forming a first oxide layer between the fins; forming a third cut between the NFET and PFET channels down into the SiGe SRB, the third cut formed parallel to the fins, and filling the third cut with a second oxide layer; recessing the first and second oxide layers down to the SiGe SRB; and removing the SiN layer.

Aspects of the present disclosure include forming the SiGe SRB with a 10% to 30% concentration of germanium (Ge). Other aspects include forming the SiGe SRB to a thickness of 1000 angstroms (Å) to 2500 Å. Further aspects include forming the Si layer to a thickness of 25 nanometer (nm) to 45 nm. Another aspect includes forming the NFET and PFET channels by: performing a well implant in the Si layer; masking a portion of the Si layer, the masked portion forming the NFET channel; etching a remaining portion of the Si layer down to the SiGe SRB; and forming a SiGe layer on the SiGe SRB adjacent to the NFET channel, the SiGe layer forming the PFET channel. Additional aspects include forming the SiGe PFET channel with a 30% to 60% concentration of Ge. Other aspects include forming the plurality of fins by: forming a third oxide layer over the SiN layer, the third oxide layer filling the first and second cuts; planarizing the third oxide layer down to the SiN layer; recessing the third oxide layer down to an upper surface of the NFET and PFET channels; removing the SiN layer; forming a second SiN layer over the third oxide layer and NFET and PFET channels; performing a lithography and etching process to define a fin pattern in the second SiN layer; and etching the NFET and PFET channels and a portion of the SiGe SRB between the fin pattern. Further aspects include planarizing the first oxide layer down to the SiN layer prior to forming the third cut; and planarizing the second oxide layer down to the SiN layer prior to recessing the first and second oxide layers. Additional aspects include the third cut removing a single NFET fin and a single PFET fin, the single NFET and PFET fins being adjacent to each other.

Another aspect of the present disclosure is a method including: forming a SiGe SRB on a Si substrate; forming a first SiN layer over the SiGe SRB; forming first and second cuts through the SiN layer and SiGe SRB, the first and second cuts formed on opposite ends of the Si substrate; filling the first and second cuts with a first oxide layer; removing the first SiN layer; forming a Si layer on the SiGe SRB; forming an NFET channel and a SiGe PFET channel in the Si layer and adjacent to each other; forming a second SiN layer over the NFET and PFET channels and first oxide layer; forming fins in the SiGe SRB through the second SiN layer and the NFET and PFET channels, the fins formed perpendicular to the first and second cuts; forming a second oxide layer between the fins; forming a third cut between the NFET and PFET channels down into the SiGe SRB, the third cut formed parallel to the fins, and filling the third cut with a second oxide; and recessing the second and third oxide layers down to the SiGe SRB.

Aspects include forming the SiGe SRB with a 10% to 30% concentration of Ge. Other aspects include forming the SiGe SRB to a thickness of 1000 Å to 2500 Å. Further aspects include forming the first SiN layer to a thickness of 10 nm to 50 nm. Additional aspects include planarizing the first oxide layer down to the first SiN layer; recessing the oxide layer down to an upper surface of the SiGe SRB; and removing the SiN layer prior to forming the Si layer. Another aspect includes forming the NFET and PFET channels by: forming a third SiN layer over the Si and oxide layers; masking a portion of the third SiN layer and the Si layer, the portion of the Si layer forming the NFET channel; etching a remaining portion of the third SiN layer and the Si layer down to the SiGe SRB; forming a SiGe layer on the SiGe SRB adjacent to and coplanar with the Si layer, the SiGe layer forming the PFET channel; and removing the third SiN layer. Other aspects include forming the fins by: forming the a third oxide layer over the second SiN layer; planarizing the third oxide layer down to the second SiN layer; performing a lithography and etching process to define a fin pattern in the second SiN layer; and etching the NFET and PFET channels and a portion of the SiGe SRB between the fin pattern. Further aspects include planarizing the second oxide layer prior to forming the third cut; and removing the second SiN layer after recessing the second and third oxide layers. Additional aspects include the third cut removing a single NFET fin and a single PFET fin, the single NFET and PFET fins being adjacent to each other.

Another aspect of the present disclosure is a finFET device including: a SiGe SRB formed on a Si substrate; a Si NFET channel formed on a portion of the SiGe SRB; a SiGe PFET channel formed on a remaining portion of the SiGe SRB, the Si NFET channel and the SiGe PFET channel laterally separated; a plurality of NFET and PFET fins formed of the SiGe SRB and the Si NFET channel and SiGe PFET channel, respectively; and an oxide layer formed around and between the fins up to the Si NFET and SiGe PFET channels. Aspects of the device include the SiGe SRB being formed of a 10% to 30% concentration of Ge and the SiGe PFET channel being formed of a 30% to 60% concentration of Ge.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A, 1B, and 1C through 9A, 9B, and 9C, respectively, schematically illustrate two cross-sectional views and a top view of a process flow for forming a SRB finFET device with defect free elastic relaxation and uniform fin CD and profile, in accordance with an exemplary embodiment; and FIGS. 10A, 10B, and 10C through 21A, 21B, and 21C, respectively, schematically illustrate two cross-sectional views and a top view of a process flow for forming a SRB finFET device with defect free elastic relaxation and uniform fin CD and profile, in accordance with another exemplary embodiment.

DETAILED DESCRIPTION

Figure 1C:
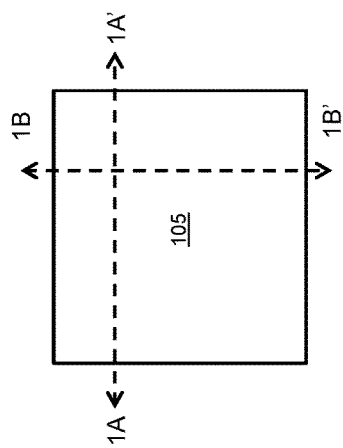
Figure 1B:
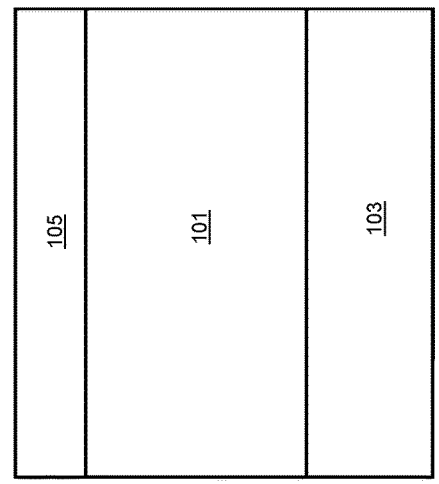
Figure 1A:
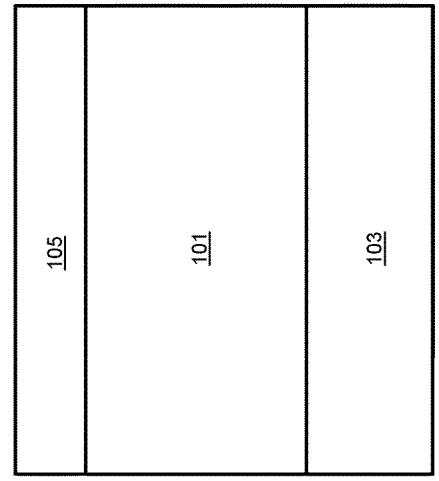

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of additional masks and significant design restrictions and/or non-uniform fin CD or profile attendant upon forming a finFET device using an early SiGe epi cut process. The present disclosure solves such problems by using a cut mask that is perpendicular to the subsequent fin direction followed by a cut mask that is parallel to the fin direction.

Methodology in accordance with embodiments of the present disclosure includes forming a SiGe SRB on a Si substrate. A Si layer is formed over the SiGe SRB, and an NFET channel and a SiGe PFET channel are formed in the Si layer and adjacent to each other. A SiN layer is formed over the NFET and PFET channels. First and second cuts are formed through the SiN layer, the NFET and PFET channels, respectively, and the SiGe SRB down to the Si substrate, the first and second cuts being formed on opposite ends of the Si substrate and perpendicular to the NFET and PFET channels. Fins are then formed in the SiGe SRB through the SiN layer and the NFET and PFET channels, the fins being formed perpendicular to the first and second cuts. A first oxide layer is formed between the fins, and a third cut is formed between the NFET and PFET channels down into the SiGe SRB, the third cut being formed parallel to the fins. The third cut is filled with a second oxide layer. The first and second oxide layers are then recessed down to the SiGe SRB, and the SiN layer is removed.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1A, 1B, and 1C through 9A, 9B, and 9C, respectively, schematically illustrate a process flow for forming a SRB finFET device with defect free elastic relaxation and uniform fin CD and profile, in accordance with an exemplary embodiment. FIGS. 1A through 9A illustrate cross-sectional views along lines 1A-1A' to 9A-9A', respectively, FIGS. 1B through 9B illustrate cross-sectional views along lines 1B-1B' to 9B-9B', respectively, and FIGS. 1C through 9C illustrate top views. Adverting to FIGS. 1A through 1C, a SiGe SRB 101 is formed (e.g., by epitaxial growth) on a Si substrate 103. The SiGe SRB 101 may be formed, for example, with a 10% to 30% concentration of Ge, e.g., 25%, and to a thickness of 1000 Å to 2500 Å. A Si layer 105 is then formed (also epitaxially), e.g., to a thickness of 25 nm to 45 nm, over the SiGe SRB 101. Nwell and Pwell regions and punchthrough stop regions (not shown for illustrative convenience) may be formed underneath the Si layer 105 by performing a well implant. Phosphorous (P), boron fluoride (BF), or boron (B+) may be used for the well implant, for example, at a dosage on the order of 10e13 and at an energy of a few to a few tens of kiloelectron volts (keV).

Figure 2C:
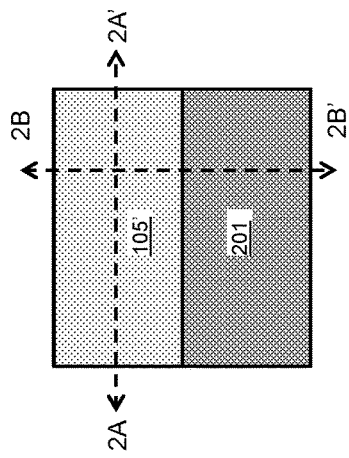
Figure 2B:
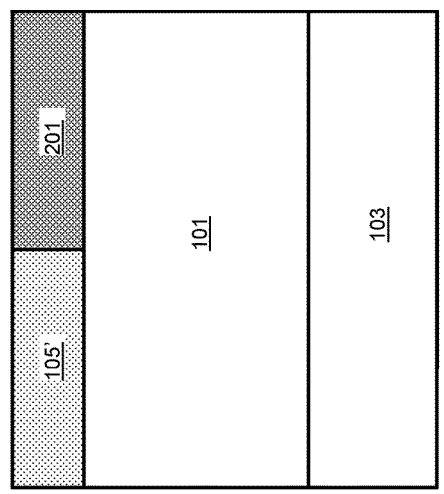
Figure 2A:
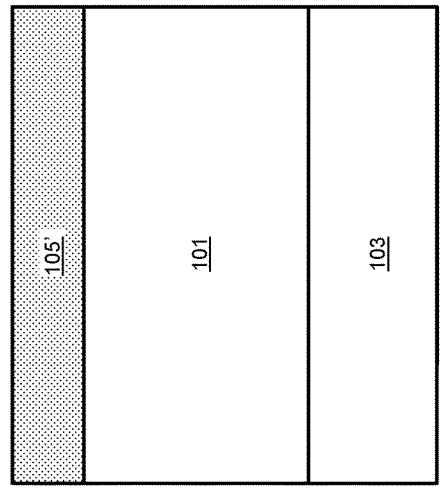

NFET and PFET channels are formed in the Si layer 105, as depicted in FIGS. 2A, 2B, and 2C. A mask (not shown for illustrative convenience) is placed over a portion of the Si layer 105 and the rest of the Si layer 105 is then etched down to the SiGe SRB 101 (also not shown for illustrative convenience). Thereafter, a SiGe layer (not shown for illustrative convenience) is formed (e.g., by epitaxial growth) on the SiGe SRB 101 adjacent to and coplanar with the Si layer 105. The remaining portion of the Si layer 105 forms the NFET channel 105', and the SiGe layer forms the PFET channel 201. The SiGe layer may be formed, for example, with a 30% to 60% concentration of Ge, e.g., 50%.

Figure 3C:
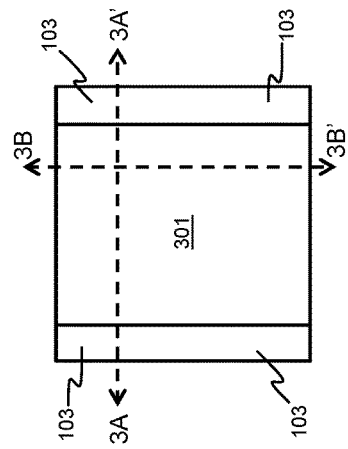
Figure 3B:
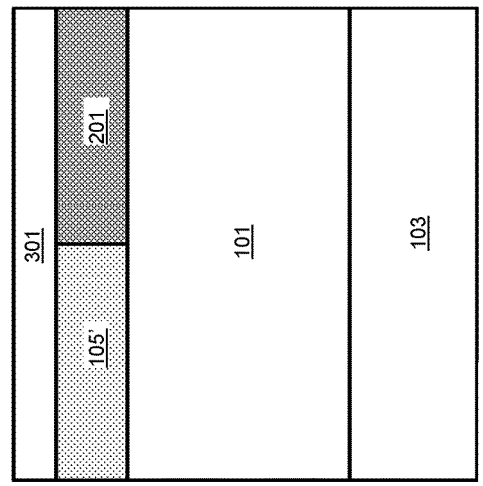
Figure 3A:
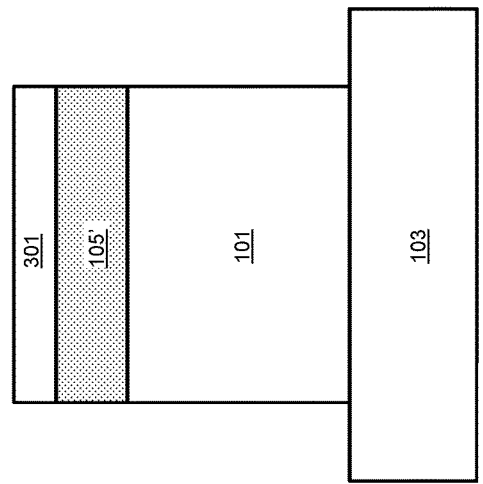

Adverting to FIGS. 3A, 3B, and 3C, a SiN layer 301 is formed over the NFET and PFET channels 105' and 201, respectively. FC cuts are then made through the SiN layer 301, the NFET and PFET channels 105' and 201, respectively, and the SiGe SRB 101 down to the Si substrate 103 at the two ends of the channels. The FC cuts are formed perpendicular to the NFET and PFET channels 105' and 201, respectively, and each FC cut may be formed, for example, with a width of 20 nm to 100 nm. By introducing the FC cut, the SRB layer 101 is elastically relaxed along the AA' direction, which can generate a tensile stress in the NFET channel 105' and a compressive stress in the PFET channel 201.

Figure 4C:
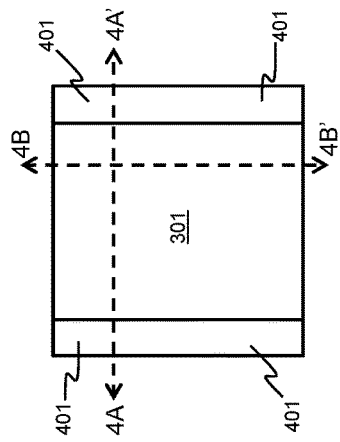
Figure 4B:
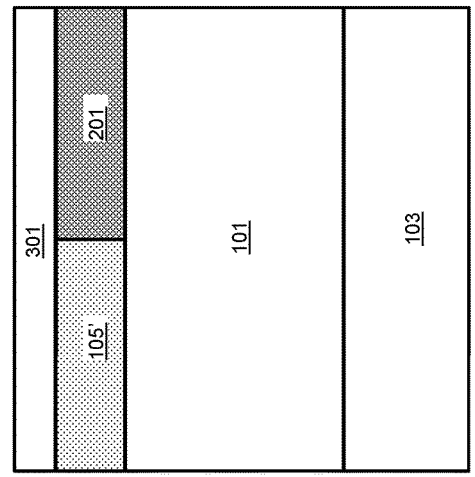
Figure 4A:
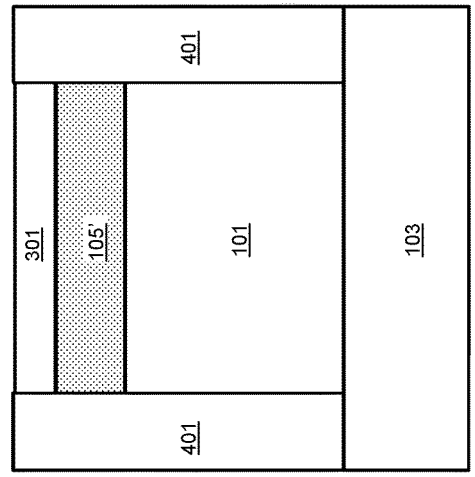

An oxide layer 401 is then formed over the SiN layer 301, filling the FC cuts, and planarized, e.g., by chemical mechanical polishing (CMP), down to the SiN layer 301, as depicted in FIGS. 4A, 4B, and 4C. Adverting to FIGS. 5A, 5B, and 5C, the oxide layer 401 is recessed down to the upper surface of the NFET and PFET channels 105' and 201, respectively, and the SiN layer 301 is stripped. Thereafter, a SiN layer 501 is formed over the oxide layer 401 and the NFET and PFET channels 105' and 201, respectively. A lithography and etching process is performed, e.g., a sidewall image transfer $2^{nd}$ decomposition (SIT2), (not shown for illustrative convenience) to define the fin pattern in the SiN layer 501.

The fins are then formed, for example, by reactive ion etching (RIE) the NFET and PFET channels 105' and 201, respectively, and a portion of the SiGe SRB 101 between the fin pattern in the SiN layer 501, as depicted in FIGS. 6A, 6B, and 6C. The fins may be formed, for example, with an individual width of 6 nm to 15 nm and with a space of 15 nm to 45 nm therebetween. The portion of the SiGe SRB 101 that remains unetched may have a thickness, for example, of 150 nm to 2 micrometer (μm). After etching the NFET and PFET channels 105' and 201, respectively, and the portion of the SiGe SRB 101, the tensile stress in the NFET channel 105' and the compressive stress in the PFET channel 201 along the AA' direction remains, and the stresses are relaxed in the BB' direction.

Adverting to FIGS. 7A, 7B, and 7C, an oxide layer 701 is formed over and between the fins and then planarized, for example, by CMP down to the SiN layer 501. Next, a FH cut is formed between the NFET and PFET channels 105' and 201, respectively, down to the SiGe SRB 101, as depicted in FIGS. 8A, 8B, and 8C. The FH cut is formed parallel to the fins and consumes, for example, a single NFET channel fin and a single PFET channel fin.

Figure 9C:
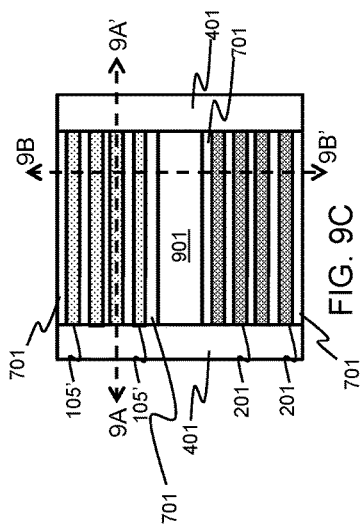
Figure 9B:
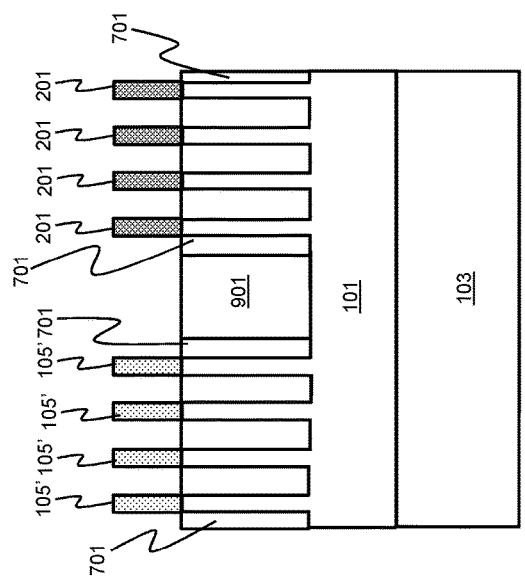
Figure 9A:
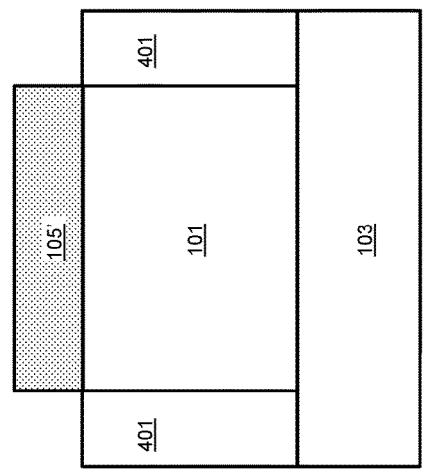

An oxide layer 901 is then formed over the oxide layer 701 and the SiN layer 501 and in the FH cut (not shown for illustrative convenience) and planarized, e.g., by CMP, down to the SiN layer 501. Thereafter, the oxide layers 701 and 901 are recessed down to an upper surface of the SiGe SRB 101, and the SiN layer 501 is removed, e.g., using hot phosphorous, as depicted in FIGS. 9A, 9B, and 9C (thereby revealing the Si fins).

Figure 10C:
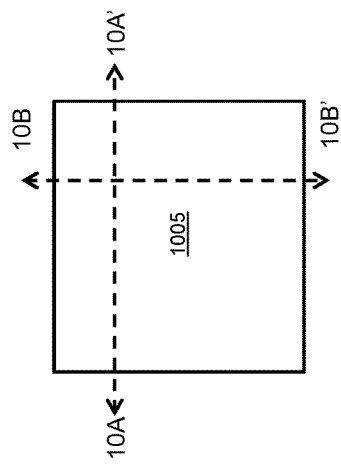
Figure 10B:
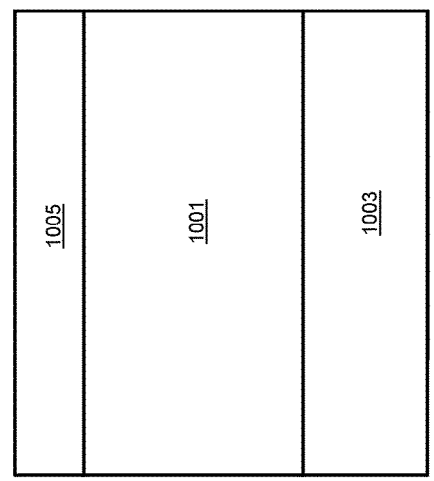
Figure 10A:
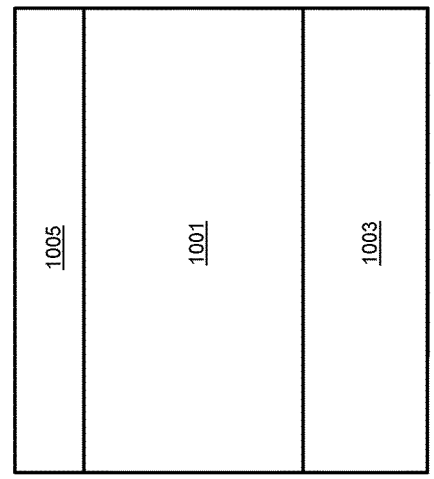

FIGS. 10A, 10B, and 10C through 21A, 21B, and 21C, respectively, schematically illustrate a process flow for forming a SRB finFET device with defect free elastic relaxation and uniform fin CD and profile, in accordance with another exemplary embodiment. FIGS. 10A through 21A illustrate cross-sectional views along lines 10A-10A' to 21A-21A', respectively, FIGS. 10B through 21B illustrate cross-sectional views along lines 10B-10B' to 21B-21B', respectively, and FIGS. 10C through 21C illustrate top views. Adverting to FIGS. 10A through 10C, a SiGe SRB 1001 is formed (e.g., by epitaxial growth) on a Si substrate 1003. The SiGe SRB 1001 may be formed, for example, with a 10% to 30% concentration of Ge, e.g., 25%, and to a thickness of 1000 Å to 2500 Å. A SiN layer 1005 is then formed, e.g., to a thickness of 10 nm to 50 nm, over the SiGe SRB 1001.

Figure 11C:
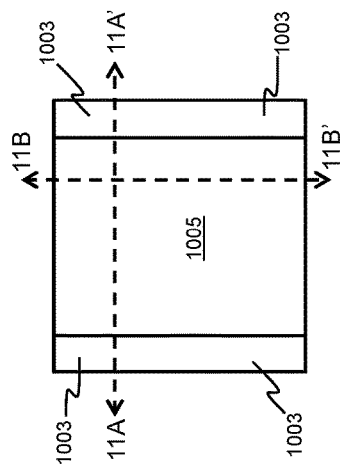
Figure 11B:
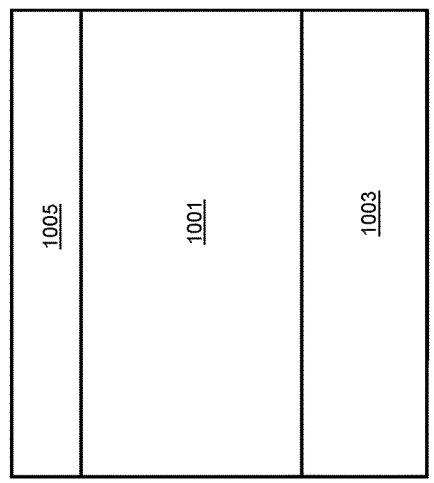
Figure 11A:
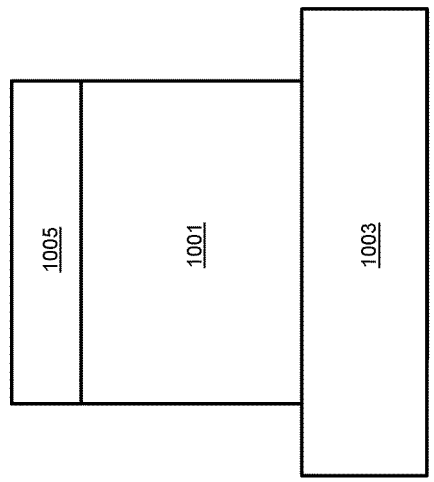

Adverting to FIGS. 11A, 11B, and 11C, FC cuts are made through the SiN layer 1005 and the SiGe SRB 1001 down to the Si substrate 1003 at the two ends of the channels. The FC cuts are formed perpendicular to the subsequently formed fins and each FC cut may be formed, for example, with a width of 20 nm to 100 nm. By introducing the FC cut, the SRB layer 1001 along the AA' direction is elastically relaxed.

Figure 12C:
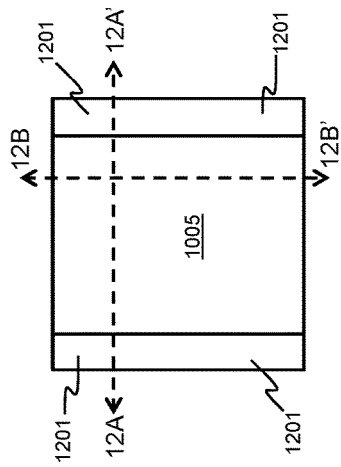
Figure 12B:
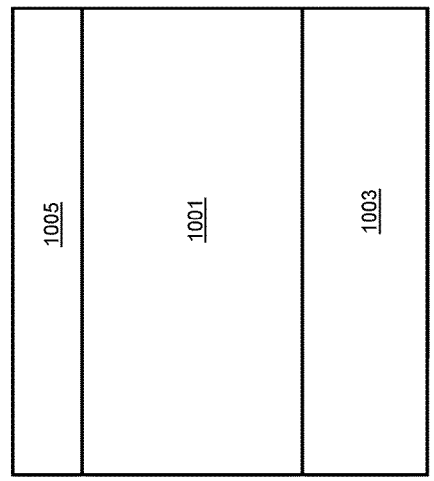
Figure 12A:
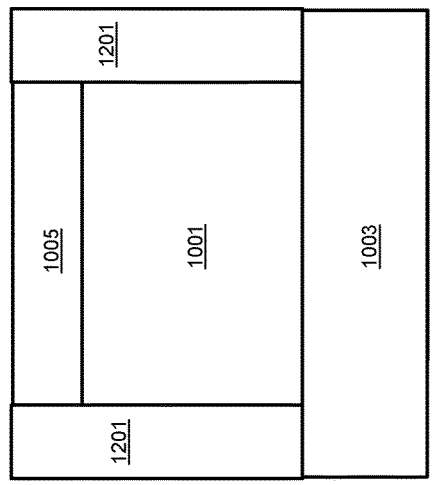
Figure 13C:
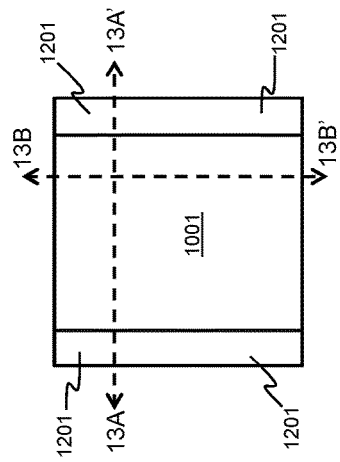
Figure 13B:
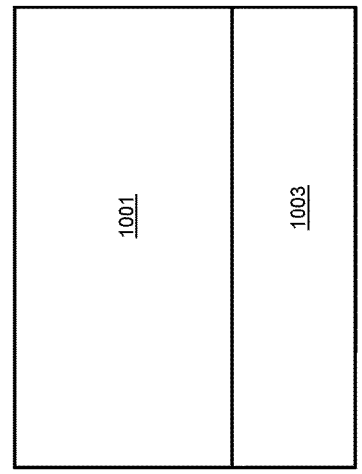
Figure 13A:
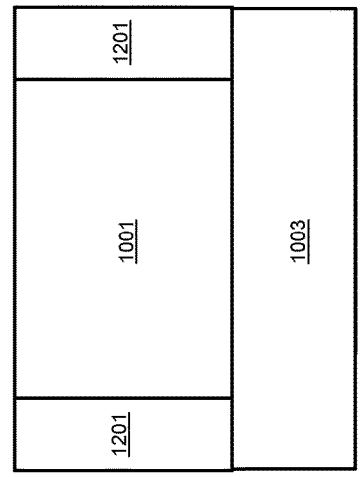

An oxide layer 1201 is then formed over the SiN layer 1005, filling the FC cuts, and planarized, e.g., by CMP, down to the SiN layer 1005, as depicted in FIGS. 12A, 12B, and 12C. Next, the oxide layer 1201 is recessed down to the upper surface of the SiGe SRB 1001, and the SiN layer 1005 is removed, as depicted in FIGS. 13A, 13B, and 13C. Nwell and Pwell regions and punchthrough stop regions (not shown for illustrative convenience) may be formed in the SiGe SRB 1001 by performing a well implant. P, BF, or B+ may be again used for the well implant, for example, at a dosage on the order of 10e13 and at an energy of a few to a few tens of keV.

Adverting to FIGS. 14A, 14B, and 14C, a Si layer 1401 is formed (e.g., by epitaxial growth) on the SiGe SRB 1001. The Si layer 1401 may be formed, for example, to a thickness of 30 nm to 45 nm. The Si layer will have tensile stress because it is grown on the relaxed SRB layer 1001, which is beneficial for NFET electron mobility. A SiN liner 1501 is then formed over the Si layer 1401 and the oxide layer 1201, as depicted in FIGS. 15A, 15B, and 15C. The SiN liner 1501 may be formed, for example, to a thickness of 3 nm to 30 nm.

A mask (not shown for illustrative convenience) is then placed over a portion of the SiN liner 1501. The remaining portion of the SiN liner 1501 as well as the underlying Si layer 1401 are then etched down to the SiGe SRB 1001 (also not shown for illustrative convenience). Thereafter, a SiGe layer (not shown for illustrative convenience) is formed (e.g., by epitaxial growth) on the SiGe SRB 1001 adjacent to and coplanar with the remaining Si layer 1401. The remaining portion of the Si layer 1401 forms the NFET channel 1401' and the SiGe layer forms the PFET channel 1601, as depicted in FIGS. 16A, 16B, and 16C. The SiGe layer may be formed, for example, with a 30% to 60% concentration of Ge, e.g., 50%, and the quality of the SiGe layer may be better relative to the formation process of FIGS. 2A, 2B, and 2C because the SiGe SRB 1001 below has already been relaxed by the FC cuts. The SiGe layer will have compressive stress because it is grown on the relaxed SiGe SRB layer 1001, which is beneficial for PFET hole mobility.

Adverting to FIGS. 17A, 17B, and 17C, the SiN liner 1501 is stripped and a new SiN layer 1701 is formed over the NFET and PFET channels 1401' and 1601, respectively. Next, an oxide layer 1703 is formed over the SiN layer 1701 and then planarized, e.g., by CMP, down to the SiN layer 1701.

Similar to FIGS. 5A, 5B, and 5C through 6A, 6B, and 6C, a lithography and etching process is performed, e.g., a SIT2 (not shown for illustrative convenience), to define a fin pattern in the SiN layer 1701. The fins are then formed, for example, by RIE in the NFET and PFET channels 1401' and 1601, respectively, and a portion of the SiGe SRB 1001 between the fin pattern, as depicted in FIGS. 18A, 18B, and 18C. The fins may be formed, for example, with an individual width of 6 nm to 15 nm and with a space of 15 nm to 45 nm therebetween. The portion of the SiGe SRB 1001 that remains unetched may have a thickness, for example, of 150 nm to 2 μm. After the fin RIE, the stress remains in the NFET and PFET channels 1401' and 1601, respectively, along the AA' direction, and the stress is relaxed along the BB' direction.

Adverting to FIGS. 19A, 19B, and 19C, similar to FIGS. 7A, 7B, and 7C, an oxide layer 1901 is formed over and between the fins and then planarized, for example, by CMP, down to the SiN layer 1701. Next, a FH cut is formed between the NFET and PFET channels 1401' and 1601, respectively, down to the SiGe SRB 1001, as depicted in FIGS. 20A, 20B, and 20C. The FH cut is formed parallel to the fins and consumes, for example, a single NFET channel fin and single PFET channel fin.

An oxide layer 2101 is then formed over the oxide layer 1901 and the SiN layer 1701 and in the FH cut (not shown for illustrative convenience) and planarized, e.g., by CMP, down to the SiN layer 1701. Thereafter, the oxide layers 1901 and 2101 are recessed down to an upper surface of the SiGe SRB 1001, and the SiN layer 1701 is removed, e.g., using hot phosphorous, as depicted in FIGS. 21A, 21B, and 21C.

The embodiments of the present disclosure can achieve several technical effects including forming a SRB finFET device with defect free elastic relaxation and uniform fin CD and profile without requiring additional masks or introducing significant design restrictions. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in finFET devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a silicon germanium (SiGe) strained relaxed buffer (SRB) on a silicon (Si) substrate;
    forming a Si layer over the SiGe SRB;
    forming an n-type field-effect transistor (NFET) channel and a SiGe p-type FET (PFET) channel in the Si layer and adjacent to each other;
    forming a silicon nitride (SiN) layer over the NFET and PFET channels;
    forming first and second cuts through the SiN layer, the NFET and PFET channels, respectively, and the SiGe SRB down to the Si substrate, the first and second cuts formed on opposite ends of the Si substrate and perpendicular to the NFET and PFET channels;
    forming fins in the SiGe SRB through the SiN layer and the NFET and PFET channels, the fins formed perpendicular to the first and second cuts;
    forming a first oxide layer between the fins;
    forming a third cut between the NFET and PFET channels down into the SiGe SRB, the third cut formed parallel to the fins, and filling the third cut with a second oxide layer;
    recessing the first and second oxide layers down to the SiGe SRB; and
    removing the SiN layer.

2. The method according to claim 1, comprising forming the SiGe SRB with a 10% to 30% concentration of germanium (Ge).

3. The method according to claim 1, comprising forming the SiGe SRB to a thickness of 1000 angstroms (Å) to 2500 Å.

4. The method according to claim 1, comprising forming the Si layer to a thickness of 25 nanometer (nm) to 45 nm.

5. The method according to claim 1, comprising forming the NFET and PFET channels by:
    masking a portion of the Si layer, the masked portion forming the NFET channel;
    etching a remaining portion of the Si layer down to the SiGe SRB; and
    forming a SiGe layer on the SiGe SRB adjacent to the NFET channel, the SiGe layer forming the PFET channel.

6. The method according to claim 5, comprising forming the SiGe PFET channel with a 30% to 60% concentration of Ge.

7. The method according to claim 1, comprising forming the plurality of fins by:
    forming a third oxide layer over the SiN layer, the third oxide layer filling the first and second cuts;
    planarizing the third oxide layer down to the SiN layer;
    recessing the third oxide layer down to an upper surface of the NFET and PFET channels;
    removing the SiN layer;
    forming a second SiN layer over the third oxide layer and NFET and PFET channels;
    performing a lithography and etching process to define a fin pattern in the second SiN layer; and
    etching the NFET and PFET channels and a portion of the SiGe SRB between the fin pattern.

8. The method according to claim 7, comprising:
    planarizing the first oxide layer down to the SiN layer prior to forming the third cut; and
    planarizing the second oxide layer down to the SiN layer prior to recessing the first and second oxide layers.

9. The method according to claim 1, wherein the third cut comprises a single NFET fin and a single PFET fin, the single NFET and PFET fins being adjacent to each other.

* * * * *